United States Patent
Nemoz et al.

(10) Patent No.: US 7,869,209 B2
(45) Date of Patent: Jan. 11, 2011

(54) ELECTRONIC RACK COMBINING NATURAL CONVECTION AND FORCED AIR CIRCULATION FOR ITS COOLING

(75) Inventors: Gerard Nemoz, Maisons Alfort (FR); Bruno Bellin, Verrieres le Buisson (FR)

(73) Assignee: Thales (FR)

( * ) Notice: Subject to any disclaimer, the term of this patent is extended or adjusted under 35 U.S.C. 154(b) by 139 days.

(21) Appl. No.: 12/438,417

(22) PCT Filed: Aug. 27, 2007

(86) PCT No.: PCT/EP2007/058872

§ 371 (c)(1),
(2), (4) Date: Feb. 23, 2009

(87) PCT Pub. No.: WO2008/025745

PCT Pub. Date: Mar. 6, 2008

(65) Prior Publication Data
US 2010/0008025 A1  Jan. 14, 2010

(30) Foreign Application Priority Data
Aug. 30, 2006  (FR) ................................ 06 07628

(51) Int. Cl.
*H05K 7/20* (2006.01)
(52) U.S. Cl. ................. 361/690; 361/694; 361/695; 361/689; 361/715; 454/184
(58) Field of Classification Search ......... 361/688–689, 361/694–695; 454/184
See application file for complete search history.

(56) References Cited
U.S. PATENT DOCUMENTS 3,648,113 A * 3/1972 Rathjen et al. .............. 361/707
4,498,118 A   2/1985 Bell
4,730,233 A * 3/1988 Osterman .................... 361/693

(Continued)

FOREIGN PATENT DOCUMENTS
EP   1011300   6/2000

(Continued)

OTHER PUBLICATIONS
U.S. Appl. No. 11/722,319, filed Jun. 20, 2007, Gerard Nemoz et al. (Not Yet Published).

(Continued)

*Primary Examiner*—Gregory D Thompson
(74) *Attorney, Agent, or Firm*—Lowe Hauptman Ham & Berner, LLP

(57) ABSTRACT

This rack (1) houses rackable electronic gear modules (2, 3) and has cooling by natural convection thanks to ventilation orifices (20, 21) provided in its bottom (10) and top (11) walls and forced air cooling thanks to internal air distribution ramps (30) fed with air under pressure through the intermediary of a distribution box (31) connected to a forced air circulation duct (37). The use of internal distribution ramps for the forced air makes it possible to produce a pulsed air circulation providing only a slight obstacle to the air circulation obtained by natural convection. Compared to usual configurations, this makes it possible to lower the operating temperature reached by the equipment in the event of loss of the forced ventilation.

14 Claims, 2 Drawing Sheets

U.S. PATENT DOCUMENTS

| | | | |
|---|---|---|---|
| 5,396,401 A | | 3/1995 | Nemoz |
| 5,477,416 A | * | 12/1995 | Schkrohowsky et al. ..... 361/695 |
| 5,940,266 A | * | 8/1999 | Hamilton et al. ............ 361/695 |
| 5,940,288 A | * | 8/1999 | Kociecki .................... 363/144 |
| 6,449,150 B1 | * | 9/2002 | Boone ........................ 361/694 |
| 6,466,441 B1 | * | 10/2002 | Suzuki ....................... 361/695 |
| 6,661,657 B1 | * | 12/2003 | Banton et al. ............... 361/690 |
| 6,997,720 B2 | | 2/2006 | Perret et al. |
| 7,254,025 B2 | * | 8/2007 | Baldwin, Jr. ................ 361/700 |
| 2006/0133033 A1 | * | 6/2006 | Straub et al. ................ 361/690 |

FOREIGN PATENT DOCUMENTS

| | | |
|---|---|---|
| FR | 2651363 | 3/1991 |
| FR | 2651636 | 3/1991 |
| FR | 2872640 | 1/2006 |

OTHER PUBLICATIONS

U.S. Appl. No. 11/915,372, filed Nov. 23, 2007, Gerard Nemoz et al. (Not Yet Published).

* cited by examiner

ELECTRONIC RACK COMBINING NATURAL CONVECTION AND FORCED AIR CIRCULATION FOR ITS COOLING

CROSS-REFERENCE TO RELATED APPLICATIONS

The present Application is based on International Application No. PCT/EP2007/058872, filed on Aug. 27, 2007, which in turn corresponds to French Application No. 0607628, filed on Aug. 30, 2006, and priority is hereby claimed under 35 USC §119 based on these applications. Each of these applications are hereby incorporated by reference in their entirety into the present application.

DOMAIN OF THE INVENTION

The invention relates to the cooling of electronic equipment housed in casings or racks placed on support platforms having forced cooling air circulation that can be subject to malfunctions. It relates notably to the casings or racks for electronic gear onboard aircraft.

BACKGROUND OF THE INVENTION

The cooling of electronic equipment in a casing is usually obtained by evacuating the calories produced inside the casing to the external environment by means of a flow of forced air penetrating into the casing through ventilation orifices situated in the bottom part serving as nozzles, coming into contact with the components of the electronic equipment and being evacuated in the top part of the casing through ventilation orifices serving as vents. The calorie evacuation capabilities increase with the cooling air flow rate. In the case of the aeronautical standards such as Arinc 600 notably, the diameter and the number of the ventilation orifices are constrained so as to respect a headloss for a standardized air flow rate, which is in turn dependent on the dissipated power. This constraint makes it possible to distribute the flow of pulsed air between the different computers.

When an electronic gear casing is also used as electromagnetic shielding, which is almost always the case for equipment onboard an aircraft, the effectiveness of the electromagnetic shielding imposes a smaller diameter on the ventilation holes, the number of which is then limited by the imposed headloss constraints. These limitations on the diameter and the number of the ventilation holes greatly restrict the capabilities of cooling by natural convection and very often make it necessary to limit the usable temperature range in case of loss of the forced ventilation.

The electronic equipment designed to be onboard aircraft is usually placed in casings that are provided with ventilation orifices of a diameter and number that are inadequate to allow normal cooling by natural convection alone and that are placed on a pulsed air distribution box, a kind of organ windchest, distributing to them a flow of cooling air under pressure meeting precise specifications, for example those given in the Arinc 600 standard relating to the configuration of casings and subracks used in aircraft to house replaceable electronic equipment, also known as "rackable" equipment.

Such an arrangement raises the difficult problem of an even distribution of the available pulsed air for the cooling between casings or disparate equipment that do not have the same cooling requirements and that, in addition, are not necessarily present. It also raises the problem, critical when it comes to safety, of the necessary continuity of certain functions handled by the electronic equipment in the case of loss of the forced cooling air flow.

In case of loss of the forced air flow, the cooling is now provided only by natural convection that is ineffective because of the excessively small cross section that can be used of the ventilation orifices that are limited in diameter and in number: in diameter by the requirements of the electromagnetic shielding and in number by the headloss imposed by the standard, and because of the volume of external air available under the casings reduced to the capacity of the pulsed air distribution box. The temperature of the equipment then increases significantly, which degrades their temperature operating range.

Control of the operating temperature of electronic equipment in the case of loss of the forced air flow is the main limitation encountered when seeking to reduce its bulk and increase its functionalities by increasing the density of the electronic circuitry because both are always accompanied by an increase in the production of calories by the liter.

Now, it is not possible to improve the cooling by natural convection in case of loss of the forced cooling air flow, by providing additional air intake orifices in the bottom parts of the casings, outside the distribution box, because these additional intake orifices contravene compliance with the specified headloss requirement, notably that given in the Arinc 600 standard.

SUMMARY OF THE INVENTION

The aim of the present invention is to remedy the above-mentioned problems. Its aim is notably to improve the cooling by natural convection of an electronic gear casing with forced air cooling to limit the increase in temperature of the electronic gear in case of loss of ventilation and allow an increase in the compactness and the integration density of the electronic gear.

Its subject is an electronic gear casing comprising orifices for ventilation by natural convection on its bottom and top walls and internal air distribution ramps fed with air under pressure through the intermediary of a distribution box connected to a forced air circulation duct.

Advantageously, the internal air distribution ramps are fixed removably to pulsed air distribution orifices of the distribution box.

Advantageously, the internal air distribution ramps are connected to pulsed air distribution orifices of the distribution box provided with isolating plugs.

Advantageously, the internal air distribution ramps are positioned in the bottom part of the casing.

Advantageously, the internal air distribution ramps are positioned horizontally.

Advantageously, the internal air distribution ramps are fed with air under pressure by a distribution box placed at the base of the rear wall of the casing.

Advantageously, the internal air distribution ramps are tubes that are closed at one end, provided with a nozzle at the other end and laterally pierced with a network of orifices serving as vents, distributed over their length and blowing in a substantially horizontal direction.

Advantageously, when the electronic gear casing consists of a rack housing removable modules positioned side by side, on the edge, in an alignment perpendicular to the bottom of the rack, the internal air distribution ramps are placed between the modules and present lateral orifices serving as vents blowing toward the modules.

Advantageously, when the electronic gear casing consists of a rack housing removable modules positioned side by side, on the edge, in an alignment perpendicular to the bottom of the rack, the internal air distribution ramps are placed horizontally, level with the bottom edges of the modules, and present lateral orifices serving as vents blowing upward, toward the modules.

Advantageously, when the electronic gear casing consists of a rack housing removable modules positioned side by side, on the edge, in an alignment perpendicular to the bottom of the rack, the internal air distribution ramps are fixed to the modules perpendicularly to the rear wall of the rack and connected, removably, to pulsed air distribution orifices of the distribution box placed on the rear wall of the rack.

Advantageously, when the electronic gear casing consists of a rack comprising backplane connectors on its rear wall and housing removable modules plugged into the backplane connectors, the distribution box is placed on the rear wall of the rack below the backplane connectors.

Advantageously, when the electronic gear casing consists of a rack housing removable modules individually equipped with a finned cover serving as a heat sink and positioned side by side, on the edge, the internal air distribution ramps are fixed to the finned covers of the modules.

Advantageously, when the electronic gear casing consists of a rack housing removable modules individually equipped with a finned cover serving as a heat sink and positioned side by side, on the edge, the internal air distribution ramps are fixed in grooves of the finned covers of the modules.

Advantageously, when the electronic gear casing consists of a rack housing removable modules positioned side by side on the edge and individually equipped with a finned cover serving as a heat sink, the fins being configured to assume a vertical orientation once the modules are in place in the rack, the internal air distribution ramps are fixed in grooves of the covers, providing a free space relative to the bottoms of the grooves.

Advantageously, when the electronic gear casing consists of a rack housing removable modules positioned side by side on the edge and individually equipped with a finned cover serving as a heat sink, the fins being configured to assume a vertical orientation once the modules are in place in the rack, the internal air distribution ramps are fixed in grooves, of the covers, providing a free space relative to the bottoms of the grooves and present lateral orifices serving as vents blowing upward, toward the fins. One beneficial effect is to speed up the flow of air originating from the natural convection and passing into the dividing space left free at the bottom of a groove by an internal air distribution ramp.

Advantageously, the internal air distribution ramps can be prolonged by one or more capillaries directed toward the components requiring a more effective cooling.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
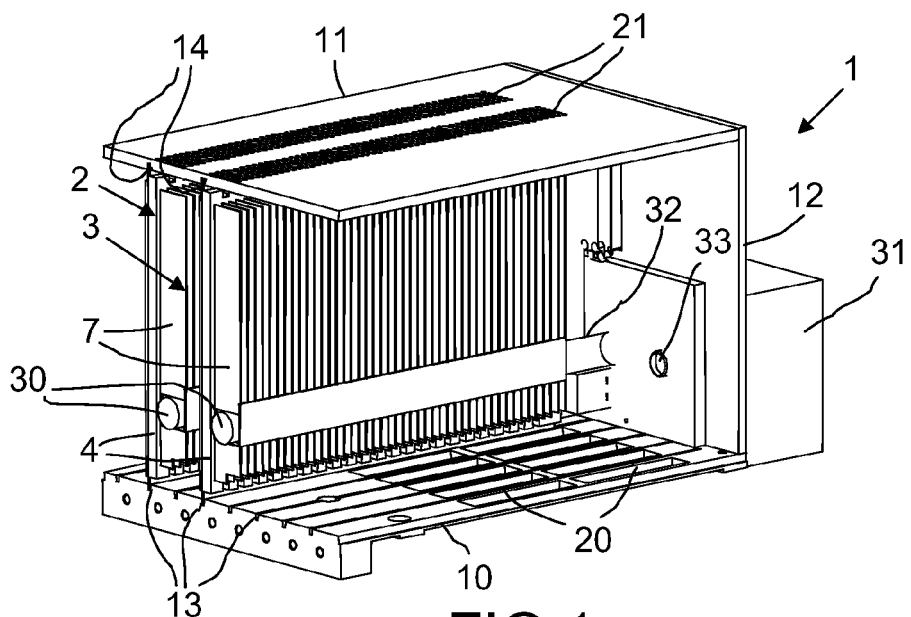
FIG. 1 is a front lateral perspective view of an electronic rack for aircraft, conforming to the invention, shown partially dismantled with two modules or rackable electronic units in place.

As illustrated in FIG. 1, the electronic rack 1 that will be described is intended to house a set of electronic modules 2, 3, called rackable because they plug into the rack like drawers.

The rackable electronic modules 2, 3 are of primarily flat rectangular shape. They comprise a printed circuit board 4 with visible longitudinal edges forming longitudinal guide edges 5, 6. This printed circuit board 4 supports:

on one of its faces or on both its faces, electronic and/or optical components that cannot be seen in the figures as well as wiring providing the electrical and/or optical interconnections for the supported components, on the component mounting face or faces, a finned cover 7 serving as a heat sink because it is in close thermal contact with the electronic and/or optical components releasing the most calories and, on one of its faces or on both its faces, a set 8 of electrical and/or optical connectors dedicated to connecting the modules to each other and to the environment outside the rack 1.

Figure 2:
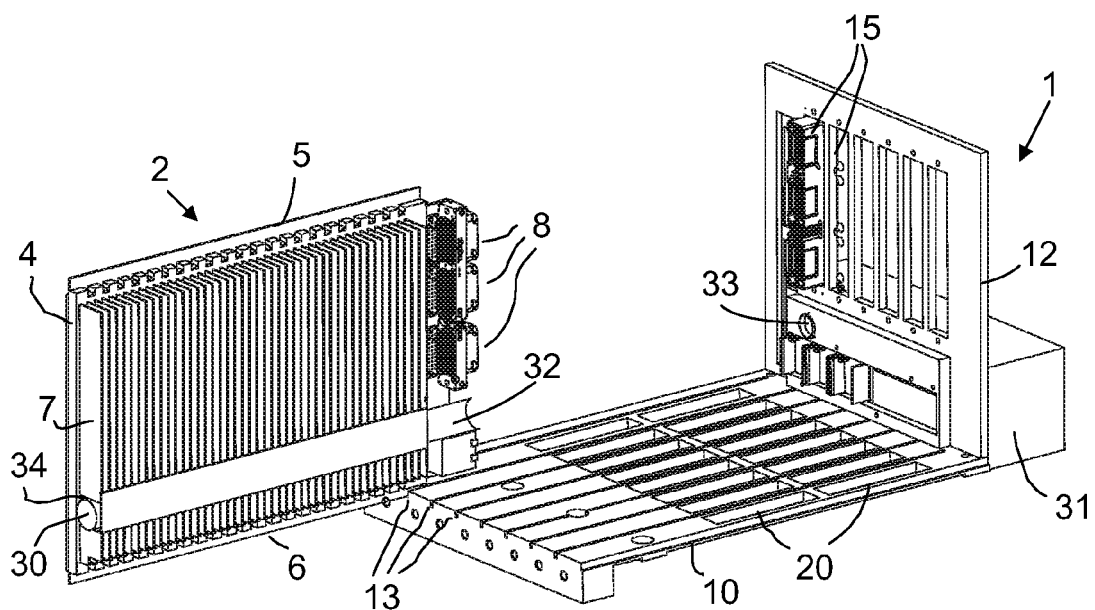
FIG. 2 is a front lateral perspective view of the electronic rack shown in FIG. 1, illustrating the movement to put in place a rackable module and the positioning on a module of an internal pulsed air distribution ramp.

The rackable electronic modules 2, 3 can have other configurations provided that they observe the dimensioning constraints imposed by the rack 1. Notably, as illustrated in FIG. 2, their guide edges 5, 6 can be fitted to the finned cover 7 in order to evacuate a proportion of the calories into the subrack of the rack 1 or to a plate that can also have an electromagnetic shielding function fixed to the face of the printed circuit board 4 opposite to that covered by the finned cover 7.

The electronic rack 1 is provided with a metal subrack, usually comprising lateral walls that are not visible in the figures, an intermediate bottom wall 10, a top wall 11 and a rear wall 12.

The intermediate bottom 10 and top 11 walls of the rack 1 support, facing each other, two networks 13 and 14 of parallel slides oriented perpendicularly to the rear wall 12 and used to guide the longitudinal edges 5, 6 of the modules 2, 3 when inserting, extracting and holding in place the modules 2, 3, side by side, on the edge, with their printed circuit boards 4 oriented in vertical planes perpendicular to the rear wall 12 of the rack 1.

The rear wall 12 of the rack 1 supports, in its top part, a set 15 of backplane connectors that mate with the set or sets 8 of connectors on the printed circuit boards 4 of the modules 2, 3 to provide the connections of the modules 2, 3 to each other and to the environment outside the rack 1.

Figure 3:
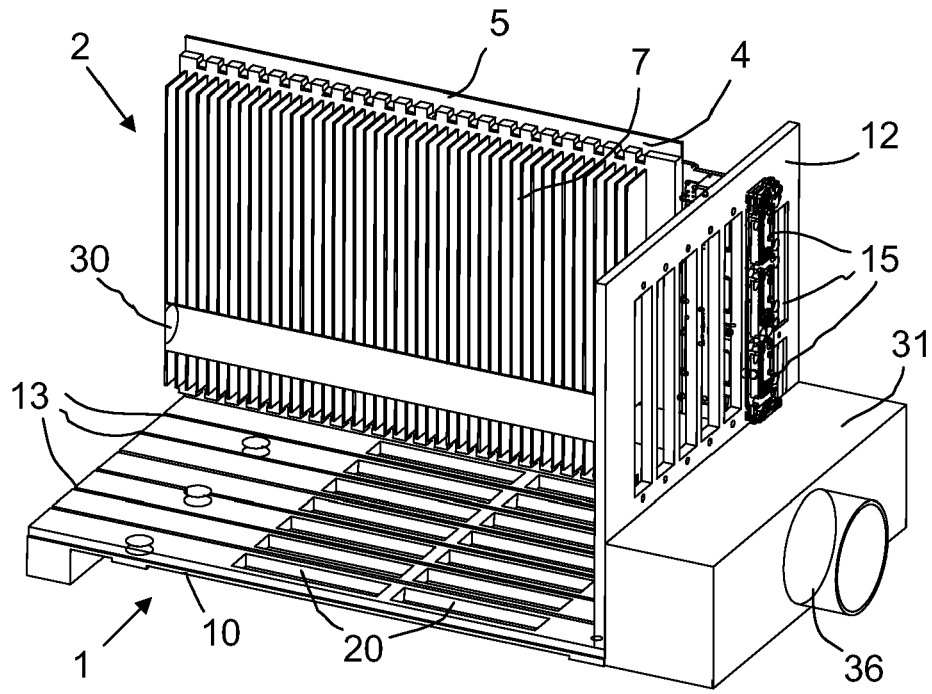
FIG. 3 is a rear lateral perspective view of the electronic rack shown in FIG. 2, illustrating the positioning of a forced air distribution box.

As shown in FIGS. 1-3, the fins of the covers 7 serving as heat sinks for the modules 2, 3 are oriented perpendicularly to the longitudinal edges of the modules 2, 3 so as to be restored to the vertical position once the modules 2, 3 are in place in the rack 1 and to facilitate their contact with an upward cooling air current obtained by natural convection and by forced circulation.

The natural convection is due to the presence of ventilation orifices 20, 21 in the intermediate bottom 10 and top 11 walls of the rack 1.

The ventilation orifices 21 provided in the top wall 11 of the rack 1 consist of holes of small diameter, of the order of 3 mm, consistent with the requirements of electromagnetic shielding. Those 20 that are made in the intermediate bottom wall 10, which is provided to separate two levels of modules, are wide longitudinal slots because the continuity of electromagnetic shielding is not provided at this level but at that of the bottom of the rack 1 which is not represented and which comprises ventilation orifices similar to those 21 of the top wall 11 with a small diameter, of the order of 3 mm.

The ventilation orifices 21 distributed over the entire surface of the top wall 11 of the rack 1, and over the entire surface of the bottom wall forming the true bottom of the rack 1, form meshed areas between the slides of the networks 13, 14 supporting the modules 2, 3, allowing a free circulation of the air with clearance spaces provided above and below the rack 1.

In addition to the natural convection ventilation, the fins of the covers 7 serving as heat sinks for the modules 2, 3 are subjected to a forced ventilation by means of pulsed air distribution ramps 30 fed through the intermediary of a distribution box 31 fixed to the outside of the rack 1, in the bottom part of its rear wall 12, below the set of backplane connectors 15 and connected by a nozzle 36 to a pressurized air duct made available to the rack 1.

The pulsed air distribution ramps 30 take the form of small "piccolos" with blocked mouths, the playing holes of which serve as lateral vents. They are positioned horizontally, at the base of the modules 2, 3 all along the finned covers 7, perpendicularly to the rear wall 12 of the rack 1, with their nozzles 32 fitted into pulsed air distribution orifices 33 of the distribution box 31 that are accessible from inside the rack 1 through the rear wall 12, and with their lateral vents blowing cooling air between the fins of the covers 7 of the modules 2, 3.

As shown in the figures, the pulsed air distribution ramps 30 are fixed to the finned covers 7 of the modules 2, 3 in grooves 34 hollowed out perpendicularly to the fins, close to their bases. Their lateral vents, not visible in the figures, face toward the bottoms of the slots separating the fins, with a slight offset upward to initiate and maintain upward air currents. Preferably, the pulsed air distribution ramps 30 are spaced apart from the bottom of the grooves 34 so as not to provide an obstacle to the upward air currents resulting from the natural convection, an amplification, by the Venturi effect, of these upward air currents even being sought by means of an adequate orientation of the vents of the ramps 30.

Figure 4:
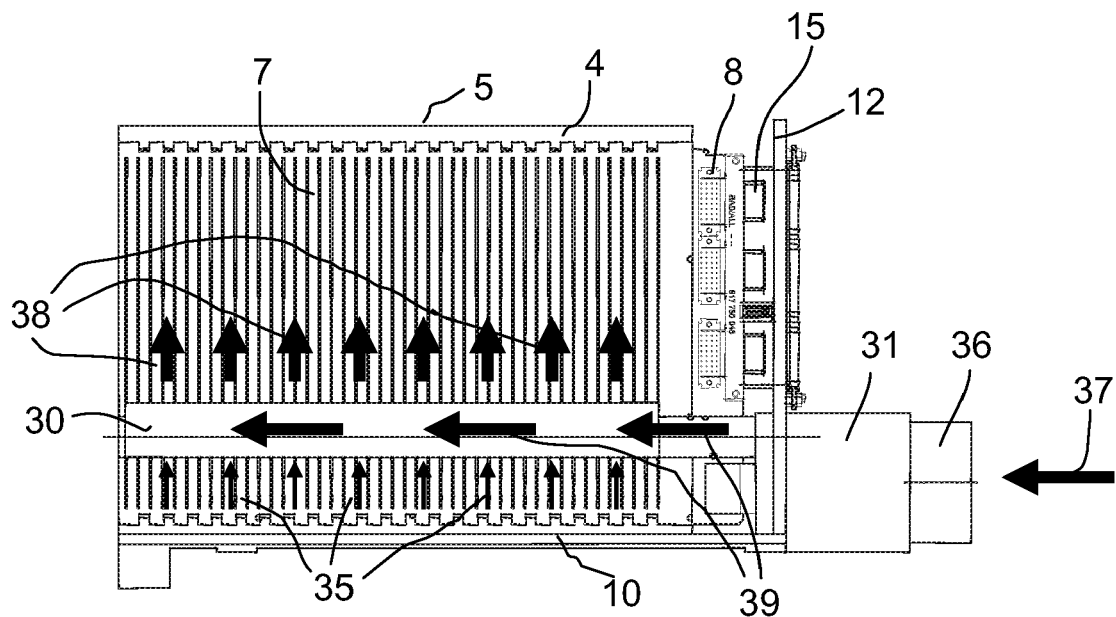
FIG. 4 is a view of the rack shown in FIG. 1 represented in profile, in a vertical cross-section, detailing the paths of the cooling air flow along a wall of a module.

FIG. 4 illustrates the distribution of the cooling air currents along a finned cover 7 of a module 2, 3, resulting from the natural convention and from the pulsed air distribution by a ramp 30.

The natural convection provokes a layer of upward cooling air currents, directed from bottom to top all along the fins, in the directions identified by the arrows 35. These upward currents originate from the clearance space provided under the rack 1 through the multiple ventilation orifices 20 provided in the bottom of the rack 1 and in the intermediate bottom walls 10, and are evacuated toward the clearance space provided above the rack 1 through the multiple ventilation orifices 21 provided in the top wall 11 of the rack 1 and, possibly, in intermediate top walls providing separations between top levels.

The pulsed air distribution from a duct connected from outside the rack 1 to the distribution box 31, recalled in FIG. 4 by the arrow 37, provokes an additional layer of upward air currents from the distribution ramp 30 to the tops of the fins, directed in the directions of the arrows 38 and provoked by the breaths from the lateral vents of the distribution ramp 30, which itself is passed through in the direction of the arrows 39 by the pulsed air leaving the distribution box 31.

The distribution orifices 33 of the distribution box 31 are fitted with isolating plugs pushed back by the nozzles 32 of the ramps 30 as they are inserted into the distribution orifices 33, at the end of the installations in the rack 1 of the modules 2, 3 that support them. Thus, the distribution orifices 33 of the distribution box 31 assigned to unoccupied equipment cells remain blocked avoiding losses of pulsed cooling air.

Furthermore, the ramps 30 as one with the modules 2, 3 can have lateral vents with flow rates customized according to the local cooling requirements appearing through the finned cover 7. They can also be prolonged by one or more capillaries directed toward the components requiring a more effective cooling.

Various configuration variants can be envisaged. The ramps 30 can be separated from the finned covers 7 of the modules 2, 3 and have their own mounting supports, for example clips fixed to the bottom wall 10 of the rack 1 between the sliders. They can even be joined to the distribution box 31. Their lateral vents can take various forms, including slotted forms.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed:

1. An electronic gear casing with cooling by natural convection and forced air circulation, comprising:
   a top wall;
   a bottom wall;
   a rear wall;
   orifices for ventilation by natural convection on said bottom and top walls;
   removable modules arranged side by side in an alignment perpendicular to the rear wall; and,
   internal air distribution ramps, wherein in each of said modules, the ramps are arranged horizontally on the bottom wall, and fed with air under pressure through a distribution box connected to a forced air circulation duct positioned at the rear wall, provoking a layer of upward air currents from each of said ramps.

2. The casing as claimed in claim 1, wherein the internal air distribution ramps are fixed removably to pulsed air distribution orifices of the distribution box, respectively.

3. The casing as claimed in claim 1, wherein the internal air distribution ramps are connected to pulsed air distribution orifices of the distribution box provided with isolating plugs, respectively.

4. The casing as claimed in claim 1, wherein the distribution box is placed at a base of the rear wall of the casing.

5. The casing as claimed in claim 1, wherein the internal air distribution ramps are tubes that are closed at one end, provided with a nozzle at the other end and laterally pierced with a network of orifices serving as vents, distributed over lengths of the orifices and blowing in a substantially horizontal direction.

6. The casing as claimed in claim 5, wherein the internal air distribution ramps are placed between the modules, lateral orifices of the ramps serving as vents blowing toward the modules.

7. The casing as claimed in claim 6, wherein the internal air distribution ramps are positioned horizontally, level with bottom edges of the modules, said lateral orifices serving as vents blowing upward, toward the modules.

8. The casing as claimed in claim 1, wherein the internal air distribution ramps are fixed to the modules perpendicularly to the rear wall of the rack and connected, removably, to pulsed air distribution orifices of the distribution box placed on the rear wall of the rack.

9. The casing as claimed in claim 8, further comprising backplane connectors on the rear wall,
wherein said removable modules are plugged into the backplane connectors, and the distribution box is placed on the rear wall below the backplane connectors.

10. The casing as claimed in claim 9, wherein said removable modules individually are provided with a finned cover serving as a heat sink, and the internal air distribution ramps are fixed to the finned covers of the removable modules.

11. The casing as claimed in claim 10, wherein the internal air distribution ramps are fixed in grooves of the finned covers of the removable modules.

12. The casing as claimed in claim 11, wherein
said removable modules individually provided with a finned cover, said cover including fins configured to assume a vertical orientation once the modules are in place in the casing, and
the internal air distribution ramps are spaced apart from a bottom of the grooves.

13. The casing as claimed in claim 12, wherein the internal air distribution ramps are laterally pierced by a network of orifices distributed over lengths of the orifices and blowing upward, toward the fins, so as to speed up the flow of air originating from the natural convection, passing into a space between the bottom of the respective groove and the respective internal air distribution ramp.

14. The casing as claimed in claim 1, wherein the internal ramps are prolonged by one or more capillaries directed toward electronic and/or optical components requiring a more effective cooling.

* * * * *